(12) United States Patent
Fasshauer

(10) Patent No.: US 8,723,715 B2
(45) Date of Patent: May 13, 2014

(54) CIRCUIT ARRANGEMENT, AS WELL AS METHOD OF CHARGING AND TRANSMISSION OF SWITCH SIGNALS

(75) Inventor: Peter Fasshauer, Neubiberg (DE)

(73) Assignee: Ident Technology AG, Wessling (DE)

( * ) Notice: Subject to any disclaimer, the term of this patent is extended or adjusted under 35 U.S.C. 154(b) by 505 days.

(21) Appl. No.: 12/446,589

(22) PCT Filed: Feb. 2, 2009

(86) PCT No.: PCT/EP2009/000671
§ 371 (c)(1),
(2), (4) Date: Apr. 24, 2009

(87) PCT Pub. No.: WO2009/095276
PCT Pub. Date: Aug. 6, 2009

(65) Prior Publication Data
US 2011/0001650 A1    Jan. 6, 2011

(51) Int. Cl.
G08C 19/12 (2006.01)
(52) U.S. Cl.
USPC .......... 341/173; 340/5.72; 345/156; 345/173; 307/10.1
(58) Field of Classification Search
USPC .................. 340/450, 572.1, 686.6, 5.72, 447, 340/539.12, 539.13, 539.26; 341/173; 345/156; 310/313
See application file for complete search history.

(56) References Cited

U.S. PATENT DOCUMENTS

2006/0261672 A1* 11/2006 Richter ........................ 307/10.1

FOREIGN PATENT DOCUMENTS

| JP | 10-145211 A | 5/1998 | ............... G01J 1/00 |
| JP | 10233717 A | 9/1998 | ............. G06K 17/00 |
| JP | 11039351 A | 2/1999 | ............... G06F 17/40 |
| JP | 2001136056 A | 5/2001 | ............. G01V 11/00 |
| JP | 2002-191566 A | 7/2002 | ............... A61B 5/00 |

OTHER PUBLICATIONS

Japanese Office Action, Application No. 2010-544647, 5 pages, Jul. 2, 2013.

\* cited by examiner

*Primary Examiner* — Nabil Syed
(74) *Attorney, Agent, or Firm* — King & Spalding L.L.P.

(57) ABSTRACT

The invention is directed to an electric circuit arrangement and to a method to collect and transfer circuit signals, in particular for use in connection with electrical devices. The object of the invention is to provide a circuit arrangement which is cost-effective to implement overall and which offers a high degree of configurability with regard to the positioning or design of switching or input zones. This object is met according to the invention by a circuit arrangement comprising a signal receiving device for the receiving of control signals, an operating signal transmitting device for the sending of operating signals of a base circuit for the processing of control signals, and at least one input circuit for the outputting of a control signal according to an input operation carried out opposite the input circuit, wherein said circuit arrangement is characterized in that the input circuit comprises an electrode device for detecting the input operation using electric field-related changes in the vicinity of the electrode device, and that the input circuit is further designed such that operational energy is fed via the operating signals present at the input circuit.

15 Claims, 15 Drawing Sheets

Figure 1:
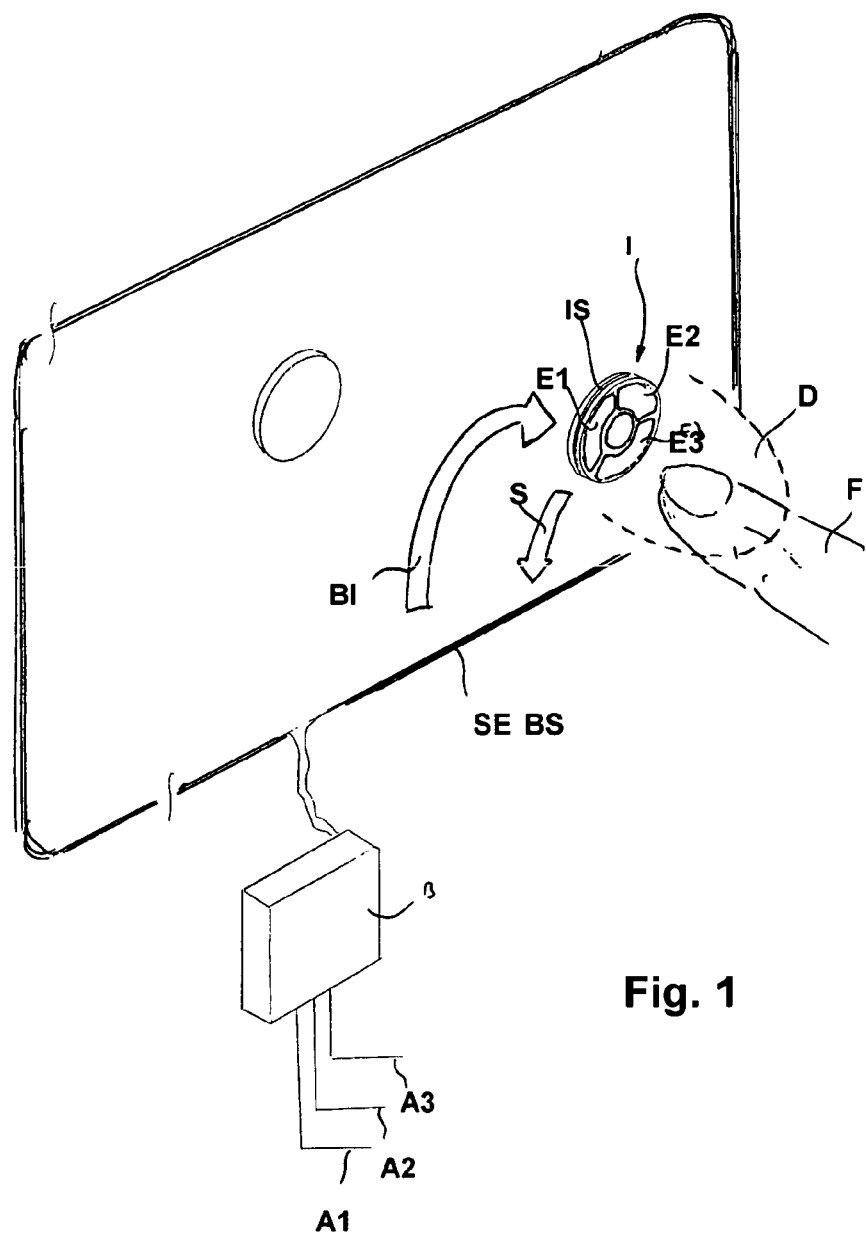

Electrodes: EL1, EL2
Switches: T1, T2
Voltage generation: D1, C1, C2
Excess voltage protection: D3, D4
Start-up switch: T3, T5
Frequency divider: IC1
Monitoring of the control pulses from the ZPS Server: D2, C3, C4, IC1
Flash memory: IC1

CIRCUIT ARRANGEMENT, AS WELL AS METHOD OF CHARGING AND TRANSMISSION OF SWITCH SIGNALS

CROSS REFERENCE TO RELATED APPLICATIONS

This application is the US national phase of PCT application PCT/EP2009/000671, filed 2 Feb. 2009 and claiming the priority of German patent application 102008006972.8 itself filed 31 Jan. 2008, German patent application 102008006970.1 itself filed 31 Jan. 2008, and German patent application 102008006969.8 itself filed 31 Jan. 2008, whose entire disclosures are herewith incorporated by reference.

The invention refers to an electric circuit arrangement as well as to a method for the charging and transmission of switch signals, especially for use in connection with electrical apparatus.

The invention is based on the task of creating a circuit arrangement which is overall realizable in a cost-effective way and which offers great freedom of design concerning the positioning or formation of the switch or input zones.

This task is resolved according to the invention by a circuit arrangement with:
- a signal receiving device for the reception of command signals,
- an operational signal transceiver arrangement for the transmission of operational signals
- a common base connection for the processing of the command signals and
- at least one input circuit for the issuing of a command signal in accordance with an input operation executed across from the input circuit, in which this circuit arrangement is characterized in that the input circuit comprises an electrode device for the recording of the input operation by means of relevant field-electrical changes in the surrounding area of the electrode device, and that the input circuit is moreover formed in such a way that an operational power supply occurs through the operational signals adjacent to the input circuit.

In this way it is possible in an advantageous way to create a circuit arrangement which allows the formation of a user-accessible input area of an electrical apparatus with ample flexibility, without extensive changes at the obstructed electronic components being undertaken hereto.

According to a particularly preferred embodiment of the invention, the operational signal transceiver arrangement is formed in such a way that it comprises a transmission coil for the transmission of a B-field which is alternating in terms of its field strength.

The input circuit, which can be accordingly placed according to need, preferably comprises an input circuit winding device for the effecting of an energy pickup from the above-described alternating B-field.

The operational signal generated through the operational signal transceiver arrangement is preferably modulated in such a way that it is at least intermittently backed up with a piece of address information.

This address information can be co-ordinated in such a way, that a determined input circuit can be directed, activated and prompted by it with regard to a definite detection occurrence.

Through this concept it is possible to construct the circuit arrangement, which accords to the invention, as such that the common-base connection can process command signals ultimately free from clashes, which are generated by numerous input circuits provided for the most diverse input operations of an input area, in particular of a switch panel.

The command signal issued by the respective input circuit is also preferably issued via the input circuit winding device so that this medium acts as a bi-directional point of intersection.

The signal receiving device is preferably formed in such a way that it comprises a signal receiving winding device for the reception of command signals issued via the input winding device. It is possible to integrate the signal receiving winding device and the operational signal winding device into a common coil. This coil is preferably positioned in such a way that the B-field generated by it covers the input circuits of the switch system with a high level of efficiency.

For this purpose, the coil is preferably run in such a way that it borders a disposition area of the input circuit. The input circuit can be formed as such so that at least the input circuit winding device is positioned in such a way that the flux lines generated via the operational signal winding device meet the input circuit winding device, preferably at a right angle.

The command signal generated via the respective input circuit can be directed back to the common-base connection by the "impedance modulation" of the operational signal.

Alternatively to this, or also in combination with this method, it is also possible to attribute the command signal to a frequency range offset opposite to the frequency range of the operational signal. It is also possible to construct the circuit arrangement so that command signals, generated via the respective input circuit with a certain time offset to the operational signal, are issued.

The operational signal can be generated in such a way that it represents a carrier signal, in which the command signal returning back to the base unit is generated by a modulation method referring to the carrier signal, especially FSK, (Q-) PSK.

The command signal can be generated in such a way that it transmits a piece of on/off information. Furthermore, it is also possible to supply input circuits that are formed in such a way that the command signals issued by this input circuit transmit a value inside a range of values, e.g. within the range of 0 to 256.

The respective input circuit can be formed by an integrated circuit (especially ASIC) in such a way that the command signal issued by it, according to a preset value, correlates to a proximity occurrence, e.g. to the proximity of a finger. It is possible to provide storage devices in the input circuit area, through which it is possible to program the input circuit for determined functional characteristics.

It is also possible to construct the circuit arrangement in such a way that the individual address of this input circuit is settable within the scope of an input circuit programming mode. It is also possible to construct the circuit arrangement in such a way that its specific address can be determined in a mechanical way e.g. via disconnection or bypassing determined, exposed line sections or the movement of switch structures.

The invention also furthermore refers to a circuit arrangement which comprises a server circuit and several client circuits and which allows it to direct signals for server circuits back via these client circuits in order, for example, to process input operations by the operator or switch processes required by the circumstances of the machine. The invention especially in this connection relates to a circuit arrangement for the processing of switch processes in electrical apparatus, or to the field of a user's environment, such as places of work and vehicle compartments in particular.

The invention, regarding this, takes the task of creating solutions as its basis, through which it is possible to process a signal transfer, existing in connection with an input operation or a detection occurrence, between several of the client circuits is serving for the signal generation and a server circuit into an improved concept from previous concepts.

This task is resolved according to the invention through a circuit arrangement with:

several client circuits for the generation of switch signals in accordance with one of the cause events adjacent to the client switch, a server circuit for the recording of switch signals which are respectively issued by the client circuits, in which the signal-technical coupling of the client circuits with the server circuit is effected on the basis of a modulated quasistatic alternating field and the client circuit is equipped with an electrode device with a first electrode, E1, and a second electrode, E2, in which this electrode device acts as an interface medium and moreover the power supply of the respective client circuit is effected via this electrode device, and in which the signal transfer from the respective client circuit to the server circuit is effected via load modulation, in which the load modulation is effected via a serial switch.

Preferably this serial switch consists of two anti-serial interconnected transistors (MOSFETs). Through this it is possible in a particularly advantageous way to maximize the degree of separation for both half waves of the server signal.

Alternatively to the above-described process it is also possible to design the serial switch as a serial connection of two sub-switches (e.g. the above-named transistors) in order to be able to use more complex modulation and signal codification forms. E.g. To modulate the first sub-switch with the client reply frequency in which the second sub-switch is modulated with a further independent frequency or a code.

The circuit arrangement according to the invention is preferably formed in such a way that the clients can be differentiated according to their modulation frequencies. By this it is possible to avoid possible clashes of transmitted data.

The modulation frequencies are preferably generated by a frequency divider in order to bring about the synchronicity to the server signal and to repress possible frequency drifting (e.g. through a temperature change) at least to a great extent.

According to a particular aspect of the present invention at least some of the client circuits are constructed in such a way that a client realized by this can alter its answer (e.g. the division ratio) by means of the data transmitted by the server. By this it is possible, in an advantageous way, to form the system in such a way that it is reconfigurable online, by which, particularly, additional options for lowering the sensitivity to dysfunction are provided.

Alternatively to an identification of the single clients by means of specific frequencies of the response signal it is also possible to lay out the client circuits in such a way that the clients can be differentiated from one another according to codes sent by them. By this it is possible to reliably manage a relatively large number of client circuits.

The client circuits can be laid out as such that they permanently undertake a signal transmission. By this it is possible to enable the information transfer in the server via the amplitude of the returning signal, e.g. 1-bit codes=yes/no, or also as a level value which correlates to a continuously changing event e.g. to a change of the dielectric characteristics in the environment of the client switch, caused by the object's proximity to the respective client.

It is especially possible to transmit information by this to the server circuit through the substantially continuous changing of the signal level, which, for example, describes the proximity of the limbs of a user to the respective client circuit.

Alternatively to the above-described permanent operational approach it is also possible for the client to work in pulse mode, in order to allow the information transfer in the server in the form of pulse width modulation and to increase the range (the pulse mode necessitates a smaller output.)

It is also possible in an advantageous way to undertake the engagement of the division relationship, respectively the individualization of the clients only after or during the pit lining in the instrument. The circuit arrangement in this respect can comprise several clients, uniform in their construction and only used within the scope of the pit lining assigned with a specific identifier. Along with the individualization of the clients in order to be able to differentiate between various clients, it is also possible to form the clients in such a way, in particular to equip them with programming or switching means, so that their functional characteristics can be adjusted according to need, e.g. whether an analog level recording should be processed or an on/off switch function should be realized. In the deployment of the circuit arrangement according to the invention in particular, in the case of electrical apparatus, it is possible to create variation means of manufactured devices by deploying the circuit arrangement according to the invention (e.g. the key assignment of a finished device is custom-made with the attached inscription of the operator panel).

The division ratio of the clients can be solidly programmed by their production.

The clients pre-configured in such a way can be characterized by small component inscriptions, or other features, so that these clients can be differentiated from each other if need be. By this it is possible to forego the programming progress after the installation, or to only undertake this for a few clients again to be modified regarding their configuration.

The coupling surfaces of a client can be formed in parallel to one another in the fashion of a plate capacitor. The single clients can be designed as small "pellet" or coin-like components. Preferably the clients are internally equipped with protection circuits that prevent incorrect loading of the sensitive circuit areas, when inadmissibly strong fields act on the respective client from the outside.

The nucleonics, realized preferably by an ASIC, can be positioned in the intermediate area between the two coupling surfaces.

It is also possible to realize client types by which the coupling areas of a client are positioned next to one another, particularly on a common face.

Such a construction is suitable especially for the recording of bridging effects, which can be caused, for example, by a change of the dielectric characteristics in the direct surrounding area of the client—e.g. by the proximity of a finger, or of an object.

It is also possible to construct the clients so that they only present small coupling surfaces, which, during the mounting of the client to a carrying structure, are contacted with these prepared electrodes (e.g. applied with conductive varnish) of suitable dimensions. By this it is possible to create extremely small clients, which for example are mounted on specific major components, cases, covers, drawers etc. by a CIM montage process, and in this respect are brought into connection with electrode systems.

The circuit arrangement according to the invention can be constructed in such a way so that through it can be checked whether one or several determined clients are situated in a defined area, or in a defined position.

It is possible to record the status of a system of an appliance by this concept.

In case of a household appliance in the form of a washing machine it can, for example, be established, whether a sieve or a washing powder compartment is in the correct position. The clients used to record the status of the system can be integrated into the corresponding components, e.g. sieve, drawer etc.

It is also possible to position the clients designed for the recording of certain system statuses so that through them it can be established whether a determined, for example removable element is positioned in a preset position.

Thus it is possible to form the above-described sieve or drawer in such a way, that through them the dielectric characteristics in the environment of the client are significantly changed, in which one of these changes allowing for signal generation can be effected via the client.

The removable component which can change its position can be formed as such, that it itself does not contain a "ZPS" client, but rather only the electric field in the environment of a surveillance ZPS client changes, which allows a conclusion as to whether the named part is present or not.

E.g. the removable part contains a conductive face which "shorts out" the field via the electrodes of the ZPS client and by this switches it off, or alternatively effects a connection to the ZPS server (or mass) and turns on the ZPS The client can be modularly constructed and in this respect include a signal processing module and an electrode module. The signal processing module can be designed as a standard module with an ASIC. The particular insert requirements can be accounted for via the electrode module.

According to a further aspect of the present invention, it is also directed toward an electric circuit arrangement as well as to a method of charging and transmitting switch signals, especially for applications in connection with electrical apparatus.

The invention in this context takes the creation of a circuit arrangement as its purpose, which is altogether cost-effectively realizable and, regarding the positioning or the formation of switch or input zones, offers high freedom of design and is defined by a high degree of reliability.

This task is resolved according to the invention through a circuit arrangement with:
 a server device for the recording of switch signals, and
 several client circuits for the transmission of these switch signals,
 in which the signal technical coupling of the client circuits with the server device on the basis of field-electric reciprocation effects takes place via the modulation of a quasistatic alternating field, and
 in which the single client circuits and the server device are thus configured, that, in the area of the server device, a clear correlation of the switch signals or of the information content of the same to the causal client switch for this switch signal is enabled.

Preferably the server device is equipped with an electrode reception device, for the reception of the switch signals. This electrode reception device can also be attached to the server device in such a way that a modulated electrical "feeding field" according to the requirement of a carrier frequency, is generated via this electrode reception device. This feeding field can also be modulated in such a way that it contains definite address information and command content via which the single client circuits can be specifically referred to.

The incorporation of the client circuits into the total system can be brought about in such a way that an intensity growth of the field-electric coupling of the client circuit with the server device is attained in connection with an input occurrence acting on the respective client circuit, in which this intensity growth is taken into account in the determining of a switch condition, or the identification of an adjusting value.

Alternatively to this, or also in combination with this measure it is also possible to reach provisions for a preferably permanent adequate field-electric coupling of the client circuits with the circuit arrangement and to record the input occurrence in the area of the client circuits locally via local switch or sensor devices, especially LC sensor networks.

The switch signal transmission from the client circuit to the server can then be effected especially through impedance modulation, or also through the additive overlaying of one or several frequencies or a code from the client on the feeding carriers.

The client circuits are preferably formed in such a way that an operational power supply is effected via the modulated electric field issued by the server device preferably with a carrier frequency.

The client circuits are, moreover, preferably formed in such a way that they each include an electrode device for the recording of the input operation by means of relevant field-electric changes in the surrounding area of the electrode device.

This electrode device preferably constitutes a part of a condenser, in which the observation area, which is provided for recording the input occurrence, contains dielectric material which co-determines the capacity of this condenser—and which changes in accordance with the input occurrence.

On the basis of the adequately recorded range of the freely positionable client circuits on the inside of the feeding field it is possible to create a circuit arrangement in an advantageous way, which allows it to form a user accessible input area of an electrical device with ample flexibility, without vast changes to the obstructed electronic components being undertaken for this purpose.

The server client system according to the invention can be formed in such a way, that a synchronous operation of the system results, especially means of digital frequency division of the carrier frequency in the client for the activation of the switch so that each client is assigned its own measure factor for frequency coding. Through this, a synchronous working frequency multiplexing system develops.

In the place of a constant frequency the client-switch can, alternatively, be activated with a code for the generation of a client ID. This code can be individually programmed in especially during the production of the client or the equipping of a carrier structure with the respective client and is selected at the activation of the client either with a gating derived from the received carrier signal or also by means of a freely running oscillator-generated gating.

SHORT DESCRIPTION OF THE FIGURES

Figure 2:
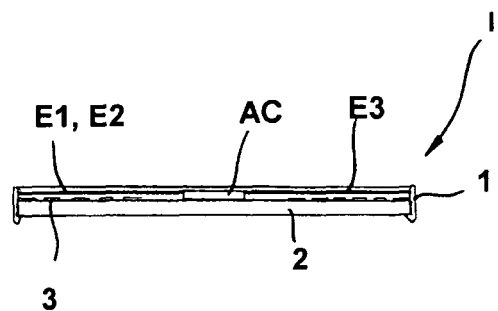
Figure 3:
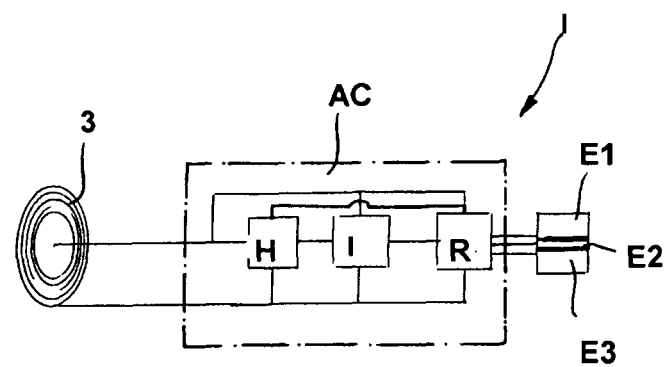
Figure 4:
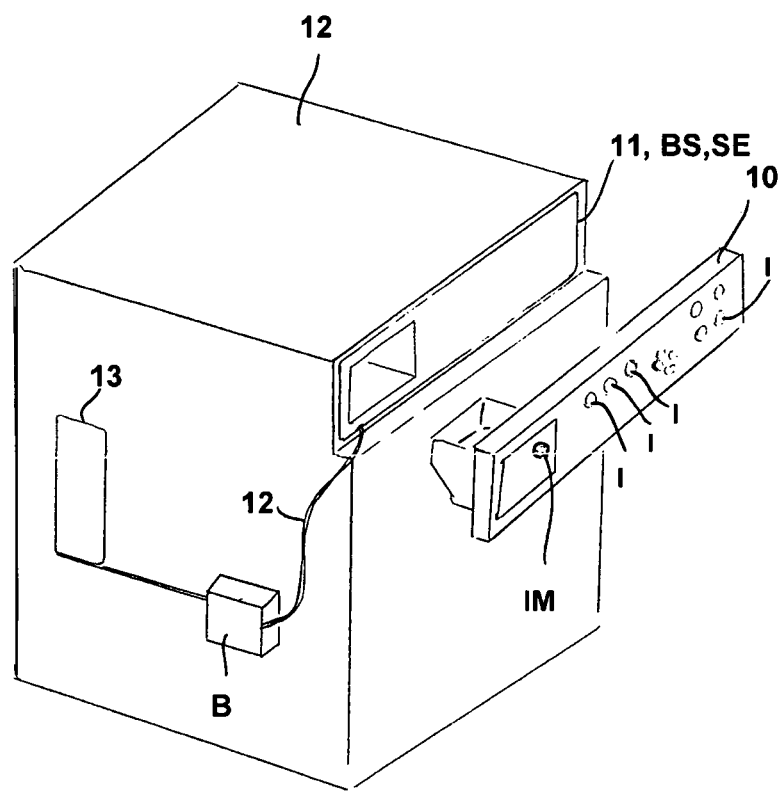
Figure 5:
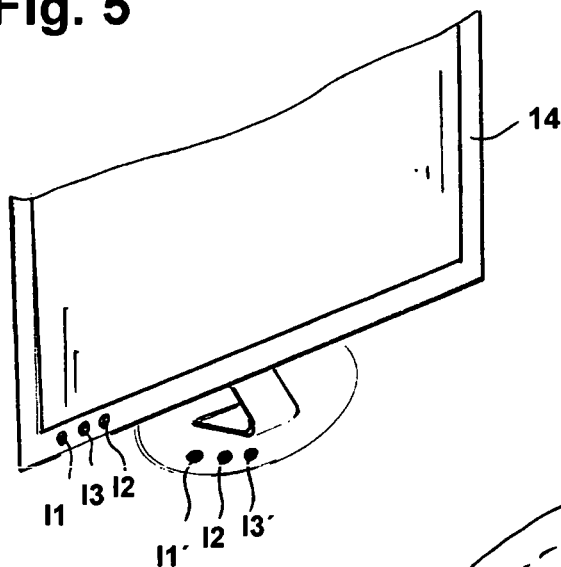
Figure 6:
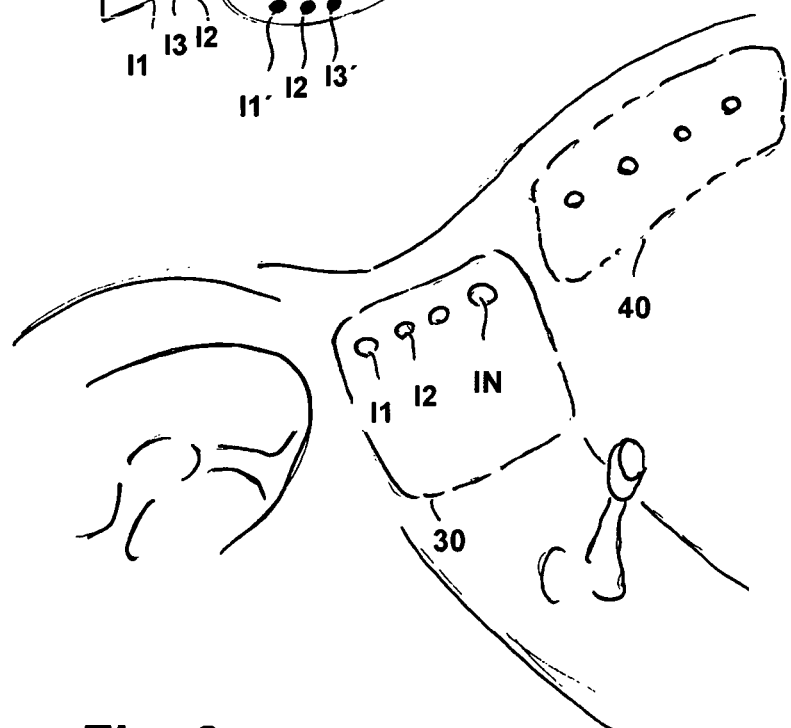
Figure 7:
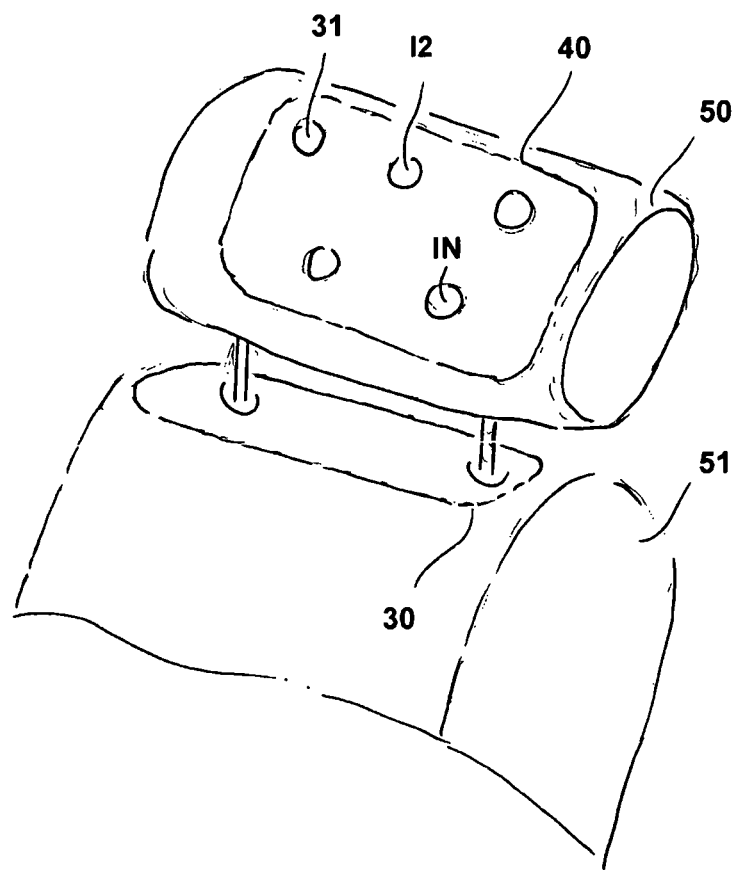
Figure 8:
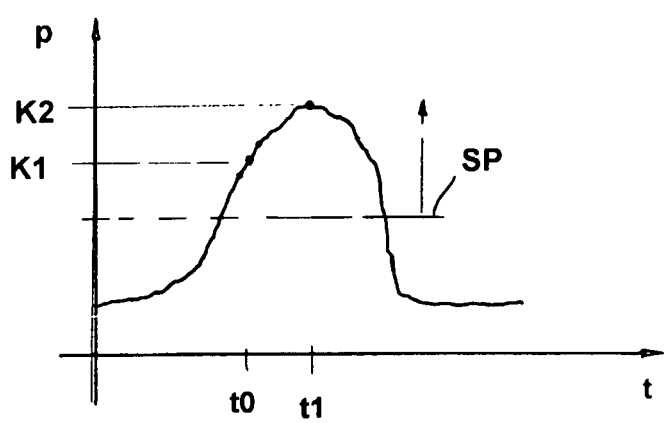
Figure 9:
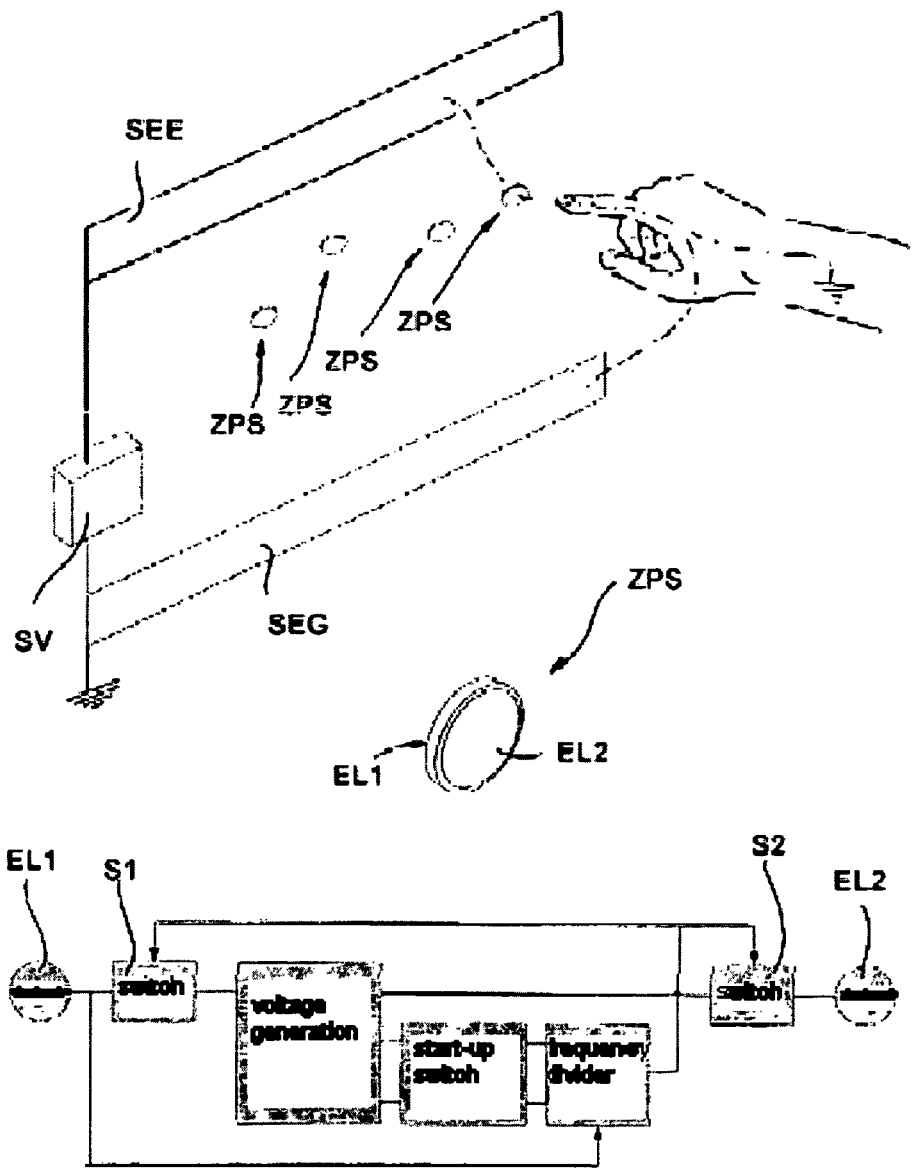
Figure 10:
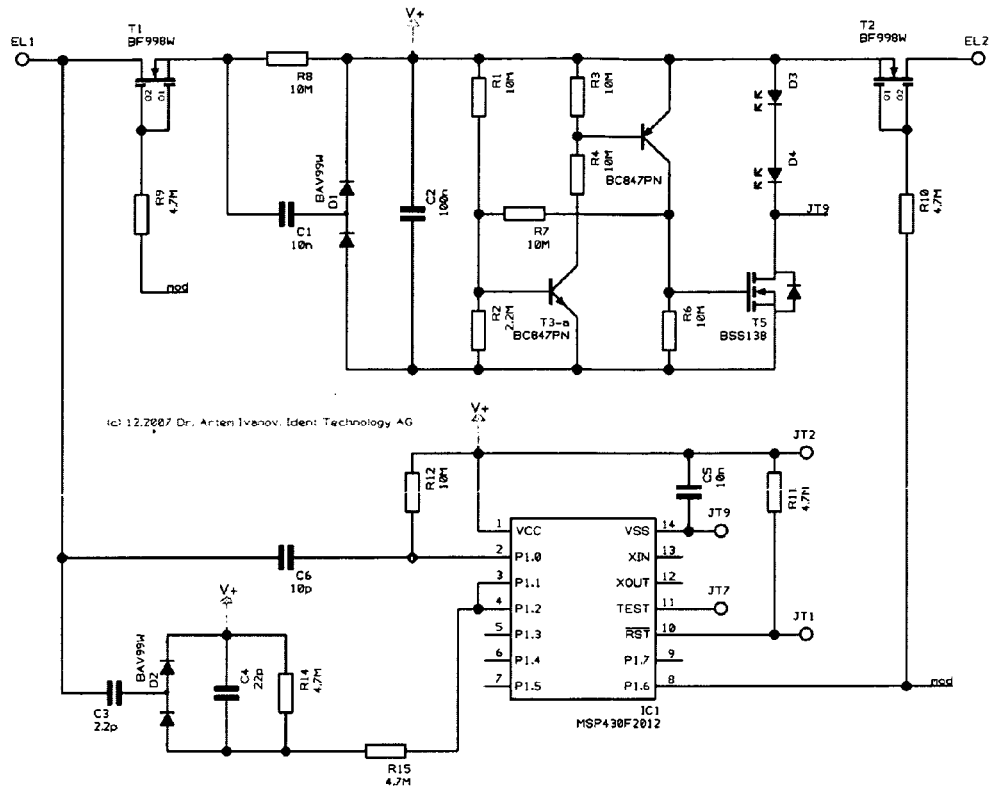
Figure 11:
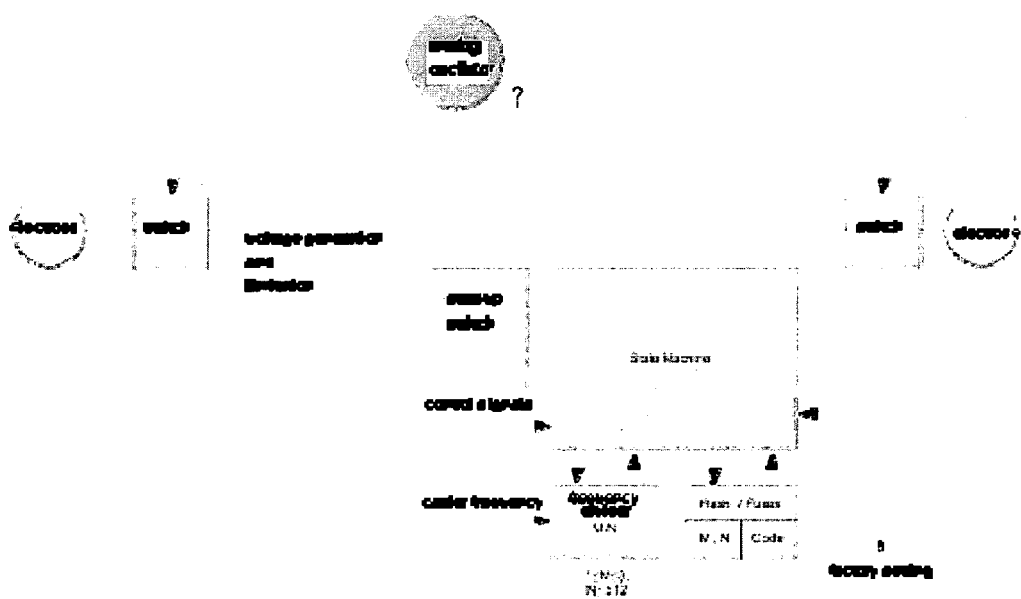
Figure 12:
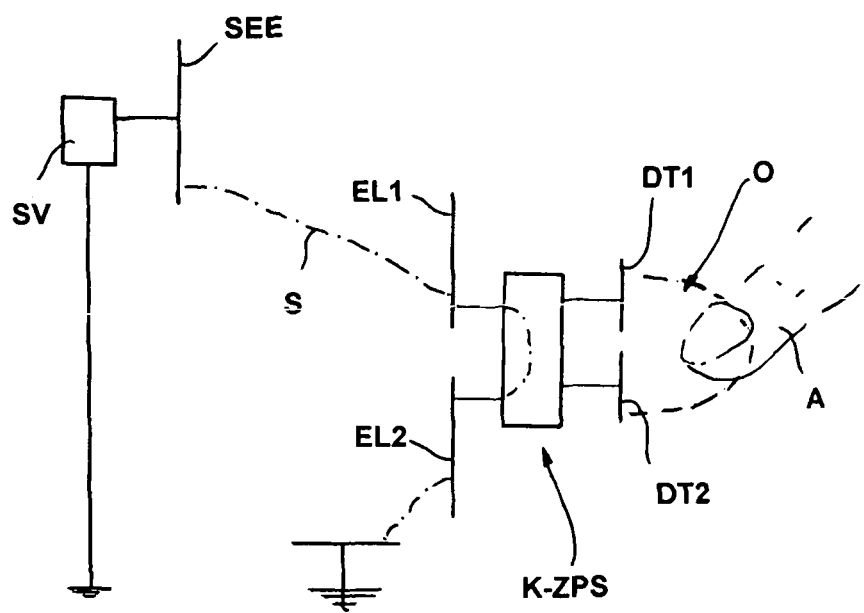
Figure 13:
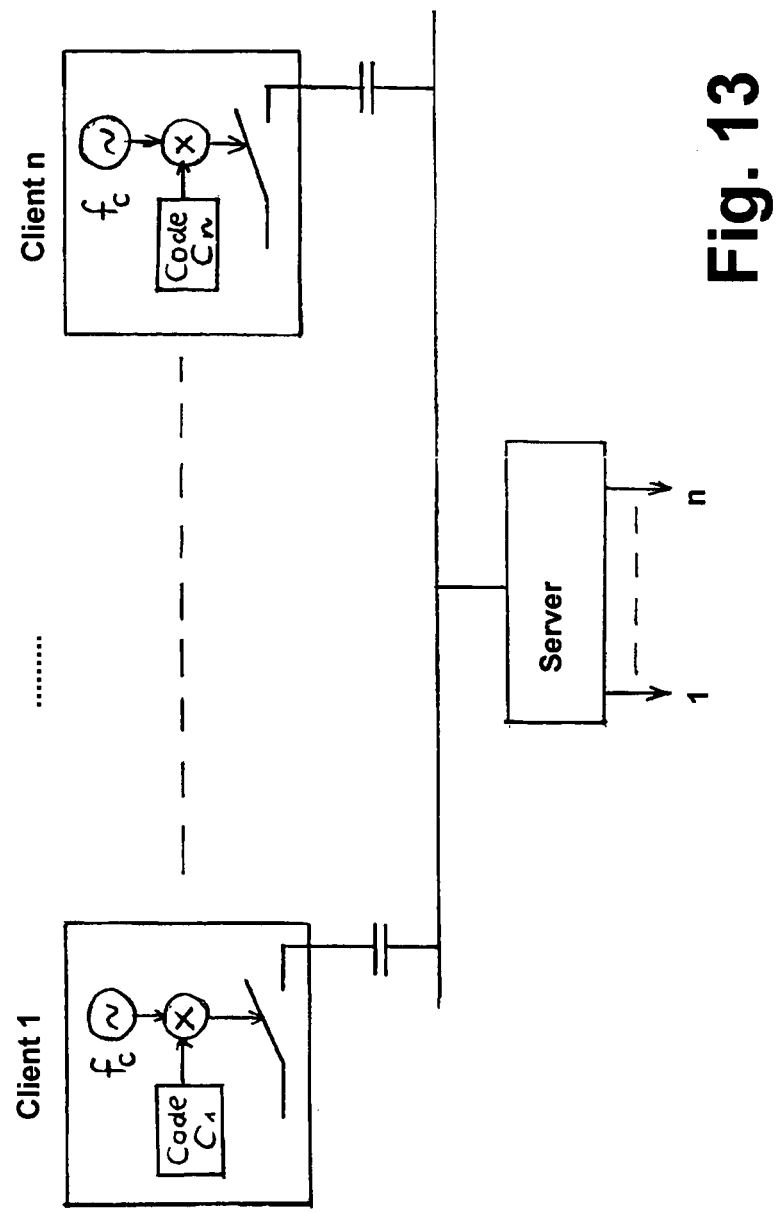
Figure 14:
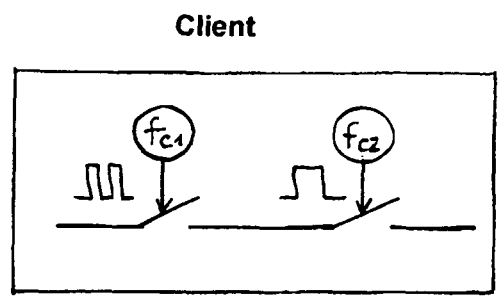
Figure 15:
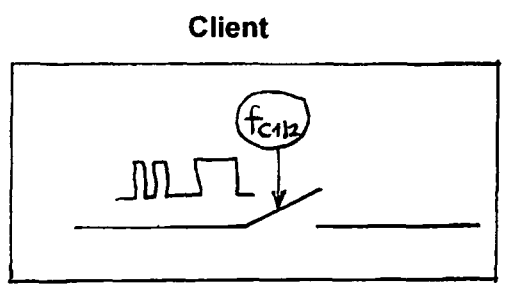
Figure 16:
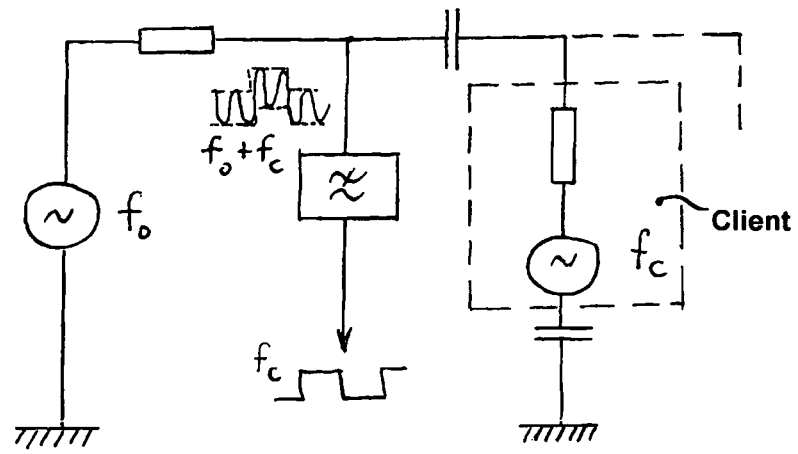
Figure 17:
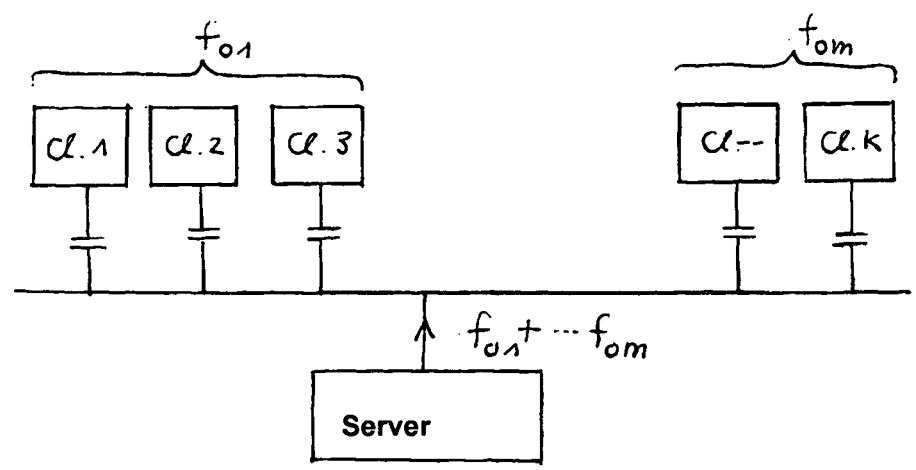
Figure 18:
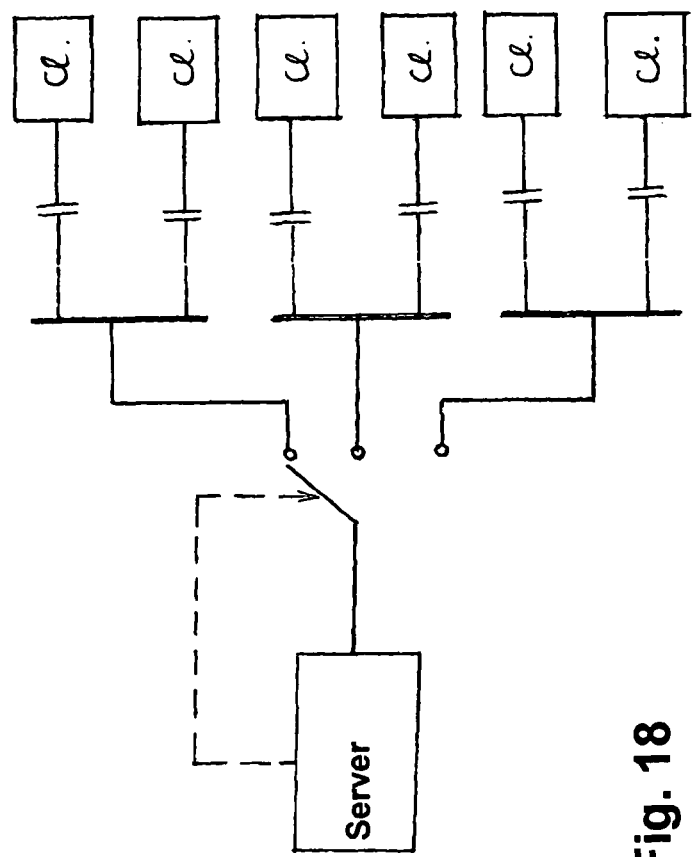

Further details and features of the invention appear in the following description in conjunction with the drawing. It shows:

FIG. 1 a scheme representation by way of illustration of the basic structure of a circuit arrangement according to the invention, FIG. 2 a cross-sectional view by way of illustration of the structure of a variably positionable input element according to the invention, FIG. 3 a scheme representation for the exemplification of a preferred circuit configuration of the input circuit according to the invention, FIG. 4 a scenography by way of illustration of the use of the circuit arrangement according to the invention in a household appliance, FIG. 5 a sketch by way of illustration of the use of the circuit arrangement according to the invention in the case of a flat-screen monitor, FIG. 6 a sketch by way of illustration of the use of the circuit arrangement according to the invention in a vehicle cockpit, FIG. 7 a sketch by way of illustration of the use of the circuit arrangement according to the invention in a motor vehicle seat, FIG. 8 a representation by way of illustration of a correlating value P with the proximity of a finger to an input circuit according to the invention FIG. 9 a sketch by way of illustration of the basic structure of a circuit arrangement according to the invention, including a block scheme of a ZPS client according to the invention for a circuit arrangement according to the invention;

FIG. 10 a circuit diagram by way of illustration of a preferred inner-construction of a ZPS client according to the invention;

FIG. 11 another block scheme by way of illustration of the structure of a further variant of a ZPS client according to the invention for a circuit arrangement according to the invention;

FIG. 12 a sketch by way of illustration of a system is variant with a signal transmission path directed to a user FIG. 13 a block scheme by way of illustration of the structure of a circuit system according to the invention in which a code is assigned to each client, whereby the codes of these clients are all issued by the same carrier frequency;

FIG. 14 a chart by way of illustration of a coding concept using two switches positioned in series;

FIG. 15 another chart by way of illustration of a further coding concept;

FIG. 16 a block scheme by way of illustration of the structure of a circuit system according to the invention in which an additive overlaying of one or several frequencies or of a code on the feeding carriers is undertaken;

FIG. 17 a block scheme by way of illustration of the structure of a circuit system according to the invention in which different groups of clients are assigned different carrier frequencies;

FIG. 18 a block scheme by way of illustration of the structure of a circuit system according to the invention in which, the electrodes for different client groups are connected one after the other via a multiplexer at the server and are fed by it.

Figure 19:
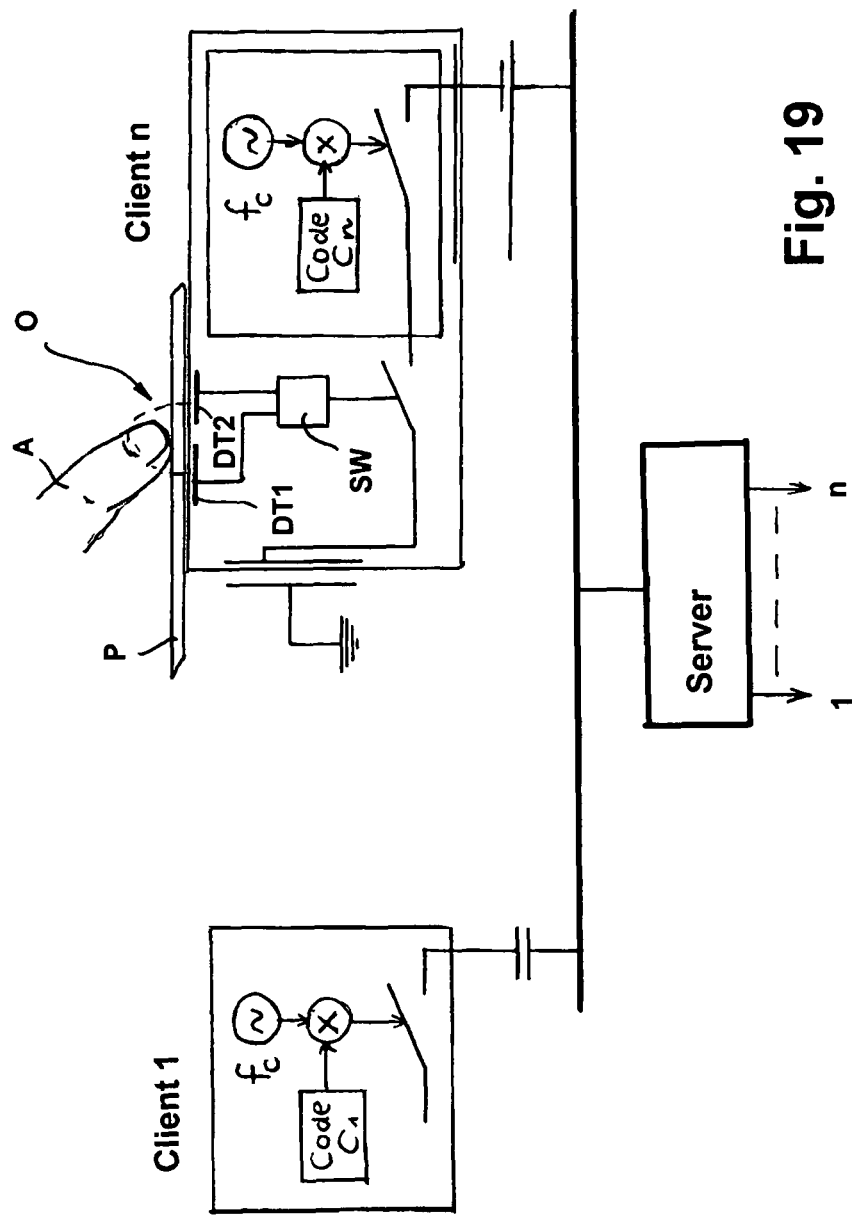

FIG. 19 a block scheme by way of illustration of the structure of a circuit system according to the invention in which the clients are formed as E-field sensors and are inwardly positioned on an operative blind element of an electro appliance, especially a household appliance.

The circuit arrangement represented in FIG. 1 comprises a signal receiving device, SE, for the reception of command signals, S, as well as an operational signal transceiver arrangement, BS, for the transmission of operational signals, BI, in which in the embodiment shown here the signal receiving device, SE, and the operational signal transceiver arrangement, BS, are combined.

The circuit arrangement further comprises a common-base connection, B, for processing the command signals received via the signal receiving device, SE, and at least one input circuit, I, for the issuing of a control signal, S, in accordance with an input operation carried out opposite the input circuit, I, for example by the finger, F, of a user, indicated here.

The circuit arrangement represented here is characterized in that the input circuit, I, comprises an electrode device E1, E2, E3, for the recording of the input operation by means of relevant field-electric changes in the surrounding area of the electrode device E1, E2; E3. The circuit arrangement is furthermore characterized in that the above-described input circuit, I, is formed in such a way, that an operational power supply results via the operational signals adjacent to the input circuit, I, transmitted via the operational signal transceiver arrangement, BS.

In the embodiment shown here, the operational signal transceiver arrangement is formed as an operational signal winding device for the transmission of operational signals, BS, in the form of a B-field, alternating with respect to its field strength. The input circuit, I, comprises an input circuit winding device, IS, for the effecting of an energy pick-up from the above-described alternating B-field.

In the embodiment shown here, the B-field, radiated by the operational signal transceiver arrangement, is modulated in such a way, that it is supplied with a piece of address information, through which the available input circuits inside the area, interfused from the B-field with sufficient intensity, can be specifically activated, that is to say, directed. In the embodiment shown here, the address information is determined via the common-base connection B.

The command signal, S, conducted to the signal receiving device, SE, also formed here as a spooler device, is also generated via the input spooler arrangement, IS, in the form of a modulated B-field in the embodiment shown here. The command signal, S, conducted to the signal receiving device, SE, is recorded via the common-base connection, B, and used by an electronic and preferably programmable circuit, integrated into the common-base connection, B, for the determining of switch conditions. Output lines A1, A2, A3 can be connected via these switch states.

In the embodiment shown here, the coil provided for the realization of the signal receiving device, SE, and provided for the operational signal transceiver arrangement is formed in such a way that it borders the schematic area of the input circuits, I. Directly inside the area bordered by this spooler device, SI, it is possible to effect a particularly efficient power supply of the input circuits, I, via the B-field picked up respectively by them. It is, however, also possible to lay out the input circuits so that their operation is already possible in the case of relatively low field strengths and to position these efficient input circuits outside the area bordered by the coil.

The feedback of the control signal, S, to the common-base connection, B, can be effected especially by special modulation methods, which, for example, refer to a carrier frequency directly provided by the operational signal, BS. The command signal, S, can be generated in such a way that it represents only a piece of on/off information, that is determined by means of processed detection criteria still in the area of the input circuit, I. It is also possible, alternatively to this, to transmit a numerical value via the command signal in a digital form which, for example, gives information about which capacity or herewith correlating size the realized capacitor of the detection LC net has, which is currently included with the electrode device E1, E2, E3. The input circuit, I, can especially be constructed in such a way, that through it proximities of human limbs in the detection range, D, represented here are recorded, in which this detection range, D, preferably comprises an expansion of approx. 60 mm.

In FIG. 2 a possible construction of an input circuit in the form of a simplified cross-sectional view, I, is shown, according to the invention formed as a pellet-like structure. The input circuit, I, comprises a case element executed as a flat plastic pot component, 1, as well as a floor section, 2. The floor section, 2, is coated with a conductor path material, in which this conductor path material is partly cut in such a way, that a spooler device with several flat windings, 3, remains on the floor section, 2. On the base plate, 2, moreover, a circuit arrangement, executed as an ASIC AC, is set up and connected with the coil, 3. A power supply of the ASIC switch is effected on the one hand via the coil, 3, and also on the other hand, an outlay of the command signals generated via the ASIC switch is effected. The ASIC switch AC is formed in such a way that the special functional characteristics of the same, especially of the specific address code of the input circuit, I, are definable within the scope of a teaching process. The electrode device E1, E2, E3 is also situated inside the plastic pot, 1, and is connected with the ASIC switch AC. This assembly can be affixed in appropriate positions inside or also possibly outside a casing of an electrical device by sticking, clamping or welding connections and thus can facilitate switch functions without a particular wiring outlay.

The basic construction of the input circuit according to the invention, I, is further exemplified in FIG. 3.

As is presented in the representation according to FIG. 3, the input circuit, I, comprises the input coil, 3, as well as the ASIC switch AC and the electrode device E1, E2; E3.

The ASIC switch AC comprises an energy harvester, H, through which the power, measured by the alternating B-field adjacent to the input coil 3, is recorded and, for example, is saved in a gold cap. Furthermore, the ASIC switch AC comprises an identification switch, I, via which by means of the signal occurrence adjacent to the spooler device, 3, it is established whether the input device, I, is affected. The ASIC switch AC moreover comprises an output arrangement, R, through which the voltage provided via the Havester arrangement, H, is modulated so that the command signal, S, can be sent out via the input coil, 3, with a certain signal content. The output arrangement, R, is coupled with the electrode device E1, E2, E3. The electrode device E1, E2, E3 is activated via the output arrangement, in which values are determined via the output arrangement, which provide information about field-electric features in the surrounding area of the electrode device E1, E2, E3.

The required energy for the setting of an alternating voltage on the electrode device E1, E2, E3 is supplied via the Havester switch H. The Havester switch, H, can be formed in such a way that, over a longer period, it undertakes an energy pickup via the input spooler arrangement, 3, from the alternating B-field adjacent to it and stores this energy, for example, in a capacitor device, in particular in a gold cap. This stored energy is then available, if the ASIC switch AC is activated by an appropriate enquiry address, for the feeding through of a test zyklus through which the capacity of the realized condenser with the inclusion of the electrode device E1, E2, E3 is determined. This capacity, or one of this sufficiently correlating size, can then be utilized in the area of the output arrangement, R, and can be used for the generation or the determining of the signal content of the control signal S.

As is evident in FIG. 4, it is possible to realize a circuit arrangement on the basis of the concept according to the invention which is particularly suitable for deployment in the case of electro appliances and household appliances.

In the case of the electrical apparatus represented here, it refers to a washing machine, for example. The signal receiving and operational signal transceiver arrangement, SE, BS which is effected as a rectangle coil, 11, and extends along the external edge of the panel accessibility area, is positioned in upper equipment area, provided in a typical way for the accessibility of a user panel, 10. This spooler device, 11, is connected via an interconnecting line, 12, with the common-base connection, B. The single components of the household appliance, for example the motor, the heating components as well as the valves are activated via the common-base connection B. The user panel 10, manufactured preferably from a plastic material, is equipped with input circuits, I, according to the invention, in the area of its back side.

In the region of the front side of the user panel, 10, switch areas can be imprinted on it. In the region of these switch areas, additional structures can be formed, especially control button structures, that additionally generate a certain haptic feedback.

After the integration of the user panel, 10, into the household appliance, 12, the input circuits, I, included in the user panel, 10, are situated in an area of the spooler device, 11, detected by the B-field. The input circuits, I, on the one hand are supplied with energy via this B-Field adjacent to the spooler device, 11, and additionally, the single input circuits, I, can be directly activated. The input circuits I are, as already mentioned, effected as E-Field sensors, through which input operations caused by human limbs by means of field-electric changes is caused through this in the surrounding area of the respective input circuit, I, are recorded. The input circuits, I, can be positioned with ample freedom of design on the user panel, 10. It is, moreover, possible, to equip the household appliance, 12, represented here with different user panels, selected, for example by the operator. Through the spooler device, 11, according to the invention it is also possible to communicate with input circuits, IM, which are integrated, for example, into moving components as the washing powder drawer portrayed here. Through these input devices, I, it can be established on the one hand, whether the washing powder drawer IM is accordingly inserted into the household appliance, 12. In addition, if necessary, the filling level of the drawer can be determined via this input circuit. By the concept according to the invention, it is possible to pick up information from ulterior areas as well, particularly those situated deeper in the appliance, and to feed it to the common-base connection, B. The common-base connection, B, can be formed in such a way that further signal transceiver and signal receiver winding devices can be activated by it.

The circuit arrangement can also include further input circuits, which, for example, bring about a signal generation via ulterior sensor and switch devices.

As evident in the representation according to FIG. 5, it is also possible to use the circuit arrangement according to the invention, for example, in electrical apparatus in the form of a screen, 14. In the casing area of the screen, 14, a spooler device, which is not shown in detail here and which acts as a signal transceiver and as a signal receiving device, is installed here. At almost any location inside or outside the non-conductive plastic case, 14, input circuits according to the invention, I1, I2, I3 can be positioned, in which the e.g. input operations effected by the operator on these input circuits I1, I2, I3 can be activated by the operator.

The concept according to the invention is especially suitable furthermore for use in the car field as well. Through the concept according to the invention it is possible, through one or fewer spooler devices, 30, 40, installed in the vehicle's interior, to create schematic areas for input circuits according to the invention I1, I2 . . . In. The input circuits I1, I2 can be arranged I2 . . . in the area bordered by these spooler devices 30, 40, with ample freedom of design.

The input circuits can be thus formed so that they ultimately replace classic switch mediums. It is also possible to realize proximity sensors via these input circuits I1, I2, I3 through which, for example, an automatic opening of a glove box can be attained when a user nears a certain area of this glove box with a certain movement.

On the basis of the concept according to the invention it is, moreover, also possible, as evident in FIG. 7, to realize a tracking system for a head rest, while preferably several input circuits I1, I2 . . . In are integrated in the head rest 50, in which level values, delivered respectively via these input circuits I1, I2, . . . In indicative with regard to the state of the nearing the head, can ultimately determine in each case whether the head rest device, 50, is situated in the correct vertical position or whether it has to be repositioned by an electric adjusting drive. The spooler devices 30, 40 provided for the power supply and for the processing of the signal transfer can either be installed in the head rest, 50, as indicated here, or, also, in the area of the car seat back 51. In the disposition of the spooler device, 51, in the area of the car seat back it is possible, in an advantageous way, to store the entire headrest adjusting motor function in the area of the seat back 51 and to integrate an adequate number of input devices I1, I2, I3 into the head rest 50, which are formed according to the invention and supplied with energy through the B-field.

In FIG. 8, the rise of a level value, P, is illustrated in the form of a simple graphic, which as such is noticeable in the event of the proximity of human limbs to the input device according to the invention, I. It is possible to determine definite switch functions from the temporal course of the level rise under traction round laying of evaluation criteria, e.g. levels+dynamics. In the embodiment shown here it is, for example, possible on the one hand to ascertain whether a level rise with a certain rise gradient occurs above a threshold level, SP, and whether a certain time criterion is fulfilled between the instance T0, in which this prominent rise gradient exists and the instance T1, in which the maximum level is reached. If, for example, the time gap between the level rise criterion, K1, and the level maximum value criterion, K2, is under 0.15 seconds, this can thus be interpreted, for example, as a switch operation.

Through the concept according to the invention, detection systems can also be realized by the evaluation of the signal levels of several input circuits, or by suitable electrode arrangements of special input circuits, these detection systems allowing an X/Y or possibly a Z determination of the position of a finger as well, through which touch pad or movement input systems can, advantageously, be realized.

FIG. 9 shows a circuit arrangement with several client circuits, ZPS, for the generation of switch signals in accordance with one of the cause events, caused by the operator, adjacent to the client circuit here for example by the proximity of a finger and with a definite dynamic profile. The switch arrangement moreover comprises a server circuit, SV, for the recording of switch signals which are each issued by the client circuits, ZPS. The signal-technical coupling of the client circuits, ZPS, with the server circuit, SV, occurs on the basis of a modulated quasistatic alternating field which is radiated via a transmission electrode, SEE.

The single client circuits, ZPS, are each equipped with an electrode device with a first electrode EL1 and a second electrode EL2. This electrode device acts as an interface medium and moreover serves the power supply of the respective client circuit ZPS.

The signal transfer from the respective client circuit, ZPS, to the server circuit, SV, is effected via load modulation in the area of the respective ZPS. The circuit arrangement represented here is characterized in that the load modulation is effected by a serial switch, or at least two sub-switches, S1, S2, connected in series.

A ZPS client is an electronic circuit, which
is connected capacitively to an electrical alternating field (e.g. provided by a ZPS server);
generates a signal that either comprises the identification of the client, and/or the sensor data recorded by the client;
in which this signal is transmitted to the ZPS server e.g. by means of load modulation.

A synchronous ZPS client at the same time deviates its signal frequency from the frequency of the alternating field of the ZPS Server.

The block circuit diagram according to FIG. 10a shows an advantageous basic construction of a synchronous ZPS client that has a specific identifier in the form of a frequency. This frequency is obtained by the division of the server frequency (=carrier frequency) Different client of this type are differentiated through their different frequencies.

The electric alternating field of the ZPS Servers not shown in detail here is coupled into one of the electrodes; the second electrode is connected (capacitively) with the earth plate. The coupling capacities occurring in practice lie mostly in the area of 0.1 pF to 1 pF.

The switches serve for the extensive separation of the client electronics from the electrodes.

The load modulation, by a serial switch, ensures that the changing of the load is the highest possible for the server and with this that the degree of modulation (i.e. also SNR) is maximum. The switch preferably consists of two anti-serial interconnected MOS-FETs, in order to maximize the degree of separation for both half waves of the server signal.

In the case of the variant exemplified in FIG. 10b, the voltage generation processes a DC-voltage from the carrier signal and contains overvoltage protection. The start-up switch switches on the frequency divider only after sufficient operating voltage is achieved and, switches it off in the case of a lower shortfall of the more minimal permissible operating voltage.

The generation of the modulation frequency from the carriers with the division ratio M/N results, with $1 \leq M \leq 3$; $N \leq 512$. The ZPS client does not modulate the server signal with a fixed frequency, but rather with a specific code. The ZPS client can receive and react to signals from the ZPS server accordingly, e.g. by employing other division conditions for the signal frequency and transmitting measured data. The ZPS client has intransient storage in order to store the data transmitted from the server (e.g. new division ratio). Through this, the client can receive its assigned "characteristics" only after the installation in the instrument. The possibility of programming the ZPS client during the output (for example assigning an ID to it) exists. The ZPS client can be formed in such a way that it allows more complex modulation methods, e.g. FSK, the client possibly obtaining a further switch for this purpose. The range of the ZPS client can be increased via the pulsed mode: in doing this the client collects the electric power firstly in the deactivated state in order to then use it for operation. When the energy consumption in the operation is greater than that which the client through the (very small) coupling capacity can continuously receive, it results in the pulse-like operation.

| Technical characteristics (preferably) | | | |
|---|---|---|---|
| | Min | Type | max |
| Mean input | | 1 µW | |
| Current for functional recording | 1 µA | | |

-continued

Technical characteristics (preferably)

| | Min | Type | max |
|---|---|---|---|
| Interior DC operating voltage for functional recording | 1 V | | 6 V |
| Carrier amplitude at the electrodes when the ZPS client is running | 1 V | 2 V | 20 V |
| Carrier frequency | 80 kHz | 125 kHz | 150 kHz |
| Frequencies in case of frequency codification | 0.8 kHz | | 6 kHz |
| Quantity of channels in the case of frequency codification | 20 | | 64 |
| Temperature range (automotives) | -10° C. | | 85° C. |
| Frequency stability of analogous oscillator (Temperature, operating voltage, deterioration) | | | ±30 Hz |
| Starting time | | | 10 ms |
| Follow-up time | | | 10 ms |
| Case | | HDPE | |
| Test pins | | 4 | |

FIG. 11 moreover shows a particularly preferred construction of a ZPS client according to the invention in the form of a detailed circuit diagram. The sub switches here are designed as anti-serial interconnected transistors T1, T2 (MOSFETs). Through this special concept it is possible to maximize the degree of separation for both half waves of the server signal provided on behalf of the server SV (see FIG. 1).

FIG. 12 shows a variant of a system, according to the invention, in the case of which the client circuit ZPS is effected in such a way that it indeed processes both its energy procurement and the signal transfer via the field provided by the server device SV, in which, however, the recording of a detection event—here the proximity of a finger—is effected through an electrode arrangement DT1, DT2, which includes the changes of the dielectric characteristics of the observation area, O, which are caused by the detection occurrence. On the basis of this concept it is possible to direct the signal path, S, (indicated as a chain line) to the user A. Instead of the user A, the occurrence ascertained in the observation area, O, could also be caused by a component which is to be detected—a sieve, a drawer or a similar component. It is possible to develop this component to be detected as such that it presents characteristics at least in the area of its importable areas in the observation area which allow particularly reliable detection.

It is possible to realize the detection electrodes, DT1, DT2, engineered here as discrete electrodes via the electrodes, EL1, and, EL2, as well. The core switch, K-ZPS, can be formed in such a way that it offers several connection possibilities for the recording of detection occurrences, as well as for the realization of signal transmission electrodes. The system according to the invention can be constructed in such a way that it comprises input circuits of the most different design, especially of the design according to FIG. 1 and the design according to FIG. 2.

As is evident from FIG. 12, a code multiplex system can be built in the case of the coding of the client, specified by the input, by choosing orthogonal codes, in which the various clients are no longer differentiated by frequency differences as in the case of the frequency multiplex system, but rather by the code information, which is transferred for all clients in the case of the same carrier frequency.

As exemplified in FIG. 14, a coding of the various clients can also result in that two switches situated behind each other are provided in the client, of which each one is contemporaneously operated with a different switch frequency, through which then the switch, instead of a frequency, is characterized by two frequencies and through this an especially high level of anti-failure security against narrow-band external interferences is attained.

According to FIG. 15, another possibility of coding with two or several frequencies and one switch consists in that the switch is activated sequentially with two or several different frequencies which can be interpreted as an FSK modulation of a medium switch frequency. Through this, a great degree of anti-failure security is attained in an advantageous way.

Instead of a continuous switch operation, a pulse formed operation of the switch can result, by which a low power requirement arises in the client and in this way facilitates an increase of the distance between the server and the client. By means of measurement of the pulse group duration on the part of the server, a measurement of the operating range of the bridged distance can also occur.

As on the basis of what is exemplified in FIG. 16, an additive overlay of one or several frequencies or of a code on the feeding carriers by the client is also possible instead of a load-modulation (=ASK) of the carrier due to the switch operation in the client. This occurs advantageously in that a generator, activated by the carrier of the server in the client, overcouples via the network created by the system server/client on the server electrode and, excluding the carrier frequency, the frequency mix of the client signal occurs here additively on a lower wave band (baseband). This has, on the one hand, the advantage that this signal can be very easily disassociated from the carrier by means of a low pass filter on the server and, on the other hand, potential interfering signals occurring near the carrier frequency are not incorporated back into the baseband, but rather are simply suppressed by means of the above-described lowpass filter. Furthermore, the cost of the acquisition of the client signal on the server is clearly reduced.

Advantageous Techniques to the Client

The embodiment of the electrodes at the client can occur in either a sandwich form (both electrodes parallel to one another) or also in a butterfly structure (electrodes opened against each other)

The mounting of the client can occur by clipping, bonding and also especially by the connection to other, especially larger electrode systems. The electrodes of the client can be especially realized by conductive thin films, e.g. varnish Advantageous Techniques to the Server For the warranty of an interference-free detection of the information transmitted by the client (identity and switch status) the principle of the correlation receipt is preferably used on the server, provided that a synchronous system by means of the frequency division mentioned in 1. exists. This correlation receipt occurs by means of a complex discrete Fourier transformation (DFT) on a processor, which processes all the client signals at the same time during a fixed window of time. Typically, it consists of 30 ms to 100 ms, so that after this time all the necessary information about the client in the frequency range is available as single complex numbers if the principle of a frequency multiplex system is used for the coding. Since, on the part of the server, the frequencies of the clients are known, the commonly-named Goertzel algorithm can be used for this which corresponds with the correlation receipt in the frequency range.

Organization of a Multi-Client/Server System

As evident in FIG. 17, different groups of clients can be assigned with different carrier frequencies so that they are differently activated as well, by which selection means for parts of a total system arise (=frequency multiplex operation)

As evident in FIG. 18, another possibility consists of switching the server successively via a multiplex switch temporally on several electrodes and as such to couple it to different client groups (=time multiplex operation). Through spatial distribution in single autonomous servers/client systems in various positions, a multiple system (=spatio-multiplex operation) can also be realized.

As evident in FIG. 19, it is possible to develop the clients in such a way that they can be fixed as small slices or "pill-like" components internally to a carrier component, P, especially a control panel of an electro appliance, particularly a household appliance. These components are supplied with energy by field generated by the server. The client, n, shown here has a detection electrode device DT1, DT2 through which changes of the dielectric characteristics in the environment of the electrode device DT1, DT2 by means of an LC network SW can be detected and used for the activation of the further switch shown here. Such client devices with an integrated sensor can be positioned on control panels with ample freedom of construction and through this create input zones on these control panels for the effecting of switch operations by the user.

The invention claimed is:

1. A system comprising:
a server device for recording of switch signals, and
an input panel that comprises several input zone, in which at least one client circuit is assigned to each input zone, wherein each client circuit of the at least one client circuit provide for transmission of their respective switch signals, wherein the client circuits are operable to detect a switch operation on the basis of a field-electric reciprocation effect through modulation of a quasistatic alternating field by a user,
wherein the client circuits are coupled with the server device such that the server device provides the client circuits wirelessly with energy by an alternating signal having a carrier frequency and the client circuits communicate a client identification and a sensor data to the server device by modulating a load to the alternating signal,
wherein the quasistatic alternating field for detecting said switch operation is provided by the alternating signal of the server device, and wherein the server device is equipped with an electrode which allows the generation of a field with extension which encompasses an associated area of the input panel with respect to the formation of the input zone.

2. The system according to claim 1 wherein a synchronous operation of the system is achieved by means of a digital frequency division of the carrier frequency in the client circuit wherein each client circuit generates a different frequency used for modulating a response.

3. The system according to claim 1 wherein instead of a constant frequency, the client circuit is activated alternatively with a code for the generation of a client ID.

4. The system according to claim 3 wherein the code is individually programmed in during the manufacture or the installation of the client circuit.

5. The system according to claim 4 wherein, at the activation of the client circuit, the programmed-in code is selected either with a gating derived from a received carrier signal or also by means of a gating generated by a freely running oscillator.

6. The system according to claim 1 wherein the client circuits are coded by choosing of orthogonal codes, a code multiplex system is configured, in which various clients are differentiated by a code information, which is assigned for all clients at a same carrier frequency.

7. The system according to claim 1 wherein for a coding of the various client circuits, a client circuit comprises two switches coupled in series for providing a load to the server device, of which each one of the two switches is contemporaneously operated with a different switch frequency.

8. The system according to claim 1, wherein the server device is coupled with the client circuits by an inductive coupling.

9. The system according to claim 1 wherein for coding a client circuit generates at least two frequencies for operating a single switch wherein the single switch is activated sequentially with one of the at least two frequencies, by which an FSK modulation of a medium switch frequency can be attained.

10. The system according to claim 1, wherein a client circuit is operable to modulate the load by pulse width modulation.

11. The system according to claim 1, wherein the server device is coupled with the client circuits by a capacitive coupling using a first electrode coupled with the server device and a second electrode coupled with a client circuit.

12. A system comprising:
a server device for recording of switch signals, and
an input panel that comprises several input zones, in which at least one client circuit is assigned to each input zone and the client circuits provide for transmission of their respective switch signals, wherein the client circuits are operable to detect a switch operation on the basis of a field-electric reciprocation effect through modulation of a quasistatic alternating field by a user,
wherein the client circuits are coupled with the server device such that the server device provides the client circuits wirelessly with energy by an alternating signal having a carrier frequency and the client circuits are operable to communicate a client identification and a sensor data to the server device by an additive overlay of one or several frequencies or a code from the client circuits on a feeding carrier, and
wherein the quasistatic alternating field for detecting said switch operation is provided by the alternating signal of the server device, and wherein the server device is equipped with an electrode which allows the generation of a field with an extension which encompasses an associated area of the input panel with respect to the formation of the input zone.

13. The system according to claim 12, wherein the server device is coupled with the client circuits by a capacitive coupling using a first electrode coupled with the server device and a second electrode coupled with a client circuit, and wherein the overlay is effected in that a generator activated by the carrier frequency of the server device in the client circuit is coupled with the second electrode wherein apart from the carrier frequency, a frequency mix of a client signal arises additively on a lower wave band.

14. The system according to claim 13 wherein a response signal from the client circuit can be decoded by means of a lowpass filter at the server.

15. The system according to claim 1 wherein several electrodes are connected with the server device, wherein the electrodes are assigned various spatial areas and client circuits situated therein, and wherein these electrodes are activated via a multiplexor.

* * * * *

UNITED STATES PATENT AND TRADEMARK OFFICE
CERTIFICATE OF CORRECTION

| | | |
|---|---|---|
| PATENT NO. | : 8,723,715 B2 | Page 1 of 1 |
| APPLICATION NO. | : 12/446589 | |
| DATED | : May 13, 2014 | |
| INVENTOR(S) | : Peter Fasshauer | |

It is certified that error appears in the above-identified patent and that said Letters Patent is hereby corrected as shown below:

In the Claims

Column 16,
Claim 12, line 42 "...wherein the quasistatic alternating field for detecting said..."
---Change to--- "...wherein the quasistatic alternating field for detecting a..."

Signed and Sealed this
Twenty-ninth Day of July, 2014

Michelle K. Lee
*Deputy Director of the United States Patent and Trademark Office*